United States Patent
Kato

(10) Patent No.: US 8,435,366 B2
(45) Date of Patent: May 7, 2013

(54) SHEET PEELING APPARATUS AND SHEET PEELING METHOD

(75) Inventor: Hideaki Kato, Tokyo (JP)

(73) Assignee: Lintec Corporation, Tokyo (JP)

( * ) Notice: Subject to any disclaimer, the term of this patent is extended or adjusted under 35 U.S.C. 154(b) by 191 days.

(21) Appl. No.: 12/936,850

(22) PCT Filed: Mar. 16, 2009

(86) PCT No.: PCT/JP2009/055013
§ 371 (c)(1),
(2), (4) Date: Oct. 7, 2010

(87) PCT Pub. No.: WO2009/125651
PCT Pub. Date: Oct. 15, 2009

(65) Prior Publication Data
US 2011/0036477 A1 Feb. 17, 2011

(30) Foreign Application Priority Data
Apr. 11, 2008 (JP) ................................. 2008-103401

(51) Int. Cl.
*B32B 41/00* (2006.01)

(52) U.S. Cl.
USPC ............. 156/64; 156/361; 156/366; 156/368; 156/378; 156/379

(58) Field of Classification Search ............ 156/64, 156/361, 367, 378, 379, 366, 368
See application file for complete search history.

(56) References Cited

U.S. PATENT DOCUMENTS

| 5,676,789 A | 10/1997 | Hamamura |
| 2006/0219359 A1* | 10/2006 | Miyamoto et al. ............. 156/344 |
| 2007/0126720 A1* | 6/2007 | Yamamoto et al. ........... 345/204 |
| 2007/0227648 A1 | 10/2007 | Tsujimoto et al. |

FOREIGN PATENT DOCUMENTS

| JP | 62-167177 A | 7/1987 |
| JP | 8-099769 A | 4/1996 |
| JP | 2000-012657 A | 1/2000 |
| JP | 2005-317712 A | 11/2005 |
| JP | 2006-073603 A | 3/2006 |
| JP | 2007-043047 A | 2/2007 |

OTHER PUBLICATIONS

International Search Report of PCT/JP2009/055013, mailing date May 19, 2009.

* cited by examiner

*Primary Examiner* — George Koch
(74) *Attorney, Agent, or Firm* — Westerman, Hattori, Daniels & Adrian, LLP

(57) ABSTRACT

A sheet peeling apparatus 10 includes: a sticking means 14 for sticking a peeling tape PT by pressing the peeling tape PT onto an adhesive sheet S; a moving means 15 for moving the peeling tape PT stuck to the adhesive sheet S and a holding means 11 for holding a wafer W relative to each other to peel the adhesive sheet S; a detecting means 17 for detecting the position of the outer periphery of the adhesive sheet S, and outputting a signal thereof; an input means 18 for inputting a correction value; a controlling means 19 for determining a pressing position of the peeling tape PT to the adhesive sheet S based on the output signal from the detecting means 17 and the correction value, and controlling the moving means 15 so as to stick the adhesive sheet S at the pressing position.

5 Claims, 4 Drawing Sheets

SHEET PEELING APPARATUS AND SHEET PEELING METHOD

FIELD OF THE INVENTION

This application is a national stage entry of PCT/JP2009/055013, filed on Mar. 16, 2009.

The present invention relates to a sheet peeling apparatus and a sheet peeling method, more particularly to a sheet peeling apparatus and a sheet peeling method suitable for adhering a peeling tape to an adhesive sheet stuck to an adherend, and peeling off the adhesive sheet through the peeling tape.

BACKGROUND OF THE ART

Semiconductor wafers (hereinafter, simply referred to as "wafer") are stuck with a protective adhesive sheet on the circuit surface thereof. After the wafers are subjected to various processes such as a rear face grinding process, the adhesive sheet is peeled. A peeling apparatus for such adhesive sheet is disclosed in e.g. Patent Document 1. In the document, a wafer is integrated with a ring frame through a mounting tape in order to ensure handleability thereof. A process of peeling off an adhesive sheet from the wafer is carried out by sticking a peeling tape to the outer periphery side of the adhesive sheet before moving the peeling tape relative to a table for supporting the wafer together with the ring frame.
Patent Document 1: Japanese Patent Application Laid-Open No. 2007-43047

SUMMARY OF THE INVENTION

Problems to be Solved by the Invention

However, in such arrangement, there arises such a disadvantage that when sticking the peeling tape, the adhesive sheet protruded outside the outer periphery of the wafer tends to adhere to the mounting tape. In particularly, as shown in FIG. 6, in the case of the wafer being chamfered so as to have the outer circumference thereof with a curved surface R, when the wafer W is subjected to rear face grinding after cutting the adhesive sheet S along the outer edge of the wafer, a protrusion H as described above increases, so that the above disadvantage becomes significant. This results in adhering the adhesive sheet to the mounting tape. In such a state, when the adhesive sheet is peeled off, there arises such a disadvantage that the mounting tape is pulled out by the peeling tape, thereby causing damage to the wafer.

In general, it is preferable that a sticking position of the peeling tape to the adhesive sheet is as close to the outer periphery of the wafer as possible, in order to make peeling off of the adhesive sheet easy in the early stage of the peeling. Therefore, it is considered to detect the position of the outer periphery of the adhesive sheet by using a sensor, and to control the detected position as the sticking position of the peeling tape. However, in this case, when the adhesive sheet is protruded outside the outer periphery of the wafer, such protruded part adheres to the mounting tape, and therefore there arises a disadvantage as described above. Accordingly, the advent of a sheet peeling apparatus and a sheet peeling method have been desired which are capable of preventing the adhesive sheet protruded outside it from adhering to another part, while the position of the peeling tape is brought close to the outer periphery of the wafer.

Object of the Invention

The present invention has been made in view of the desire. It is an object of the present invention to provide a sheet peeling apparatus and a sheet peeling method capable of peeling off an adhesive sheet, by sticking a peeling tape, while preventing an adhesive tape protruded outside the outer periphery of an adherend from adhering to another part.

Means for Solving Problems

In order to achieve the above object, the present invention adopts such an arrangement that a sheet peeling apparatus for sticking a peeling tape to an adhesive sheet stuck to an adherend, and peeling off the adhesive sheet from the adherend through the peeling tape, includes:

a holding means for holding the adherend; a feeding means for feeding out the peeling tape; a sticking means for sticking the peeling tape by pressing the peeling tape onto the adhesive sheet; a moving means for moving the peeling tape stuck to the adhesive sheet and the holding means relative to each other to peel the adhesive sheet; a detecting means for detecting the position of the outer periphery of the adhesive sheet stuck to the adherend, and outputting a signal thereof; an input means for inputting a correction value for performing a predetermined control of the moving means; and a controlling means for determining a pressing position of the peeling tape to the adhesive sheet based on the output signal from the detecting means and the correction value from the input means, and controlling the moving means so as to perform the sticking at the pressing position.

Preferably, in the present invention, the correction value is a protrusion amount of the outer periphery of the adhesive sheet, from the outer periphery of the adherend, and the controlling means adjusts, by the protrusion amount, the movement amount of the holding means by the moving means when determining the pressing position.

Also, such an arrangement is preferably adopted that the sticking means has a heating means capable of heating the peeling tape.

Further, a peeling method of the present invention adapts a sheet peeling method for sticking a peeling tape to an adhesive sheet stuck to an adherend, and peeling off the adhesive sheet from the adherend through the peeling tape, including steps of:

holding the adherend by a holding means;

detecting a position of the outer periphery of the adhesive sheet stuck to the adherend;

determining a pressing position of the peeling tape to the adhesive sheet based on the detected position of the outer periphery thereof and a correction value inputted by an input means;

feeding out the peeling tape;

sticking the peeling tape at the determined pressing position; and peeling the adhesive sheet by a relative movement of the peeling tape stuck to the adhesive sheet and the holding means.

Furthermore, in the peeling method of the present invention, preferably, the correction value is a protrusion amount of the outer periphery of the adhesive sheet, from the outer periphery of the adherend, and the movement amount of the holding means is adjusted by the protrusion amount when determining the pressing position.

EFFECT OF THE INVENTION

According to the present invention, the adhesive sheet can be stuck by correcting the pressing position of the peeling tape with respect to the position of the outer periphery of the detected adhesive sheet. Thus, even when the adhesive tape is protruded outside the outer periphery of the adherend, it is possible to prevent the pressed adhesive sheet from adhering to the mounting tape or the like. Therefore, the adhesive sheet can be peeled off without any difficulty. Further, it is possible to avoid causing damage to the adherend such as the wafer due to the mounting tape and the like being pulled by such peeling operation. In addition, the pressing position of the peeling tape can be brought close to the outer periphery of the adherend, so that peeling can be carried out smoothly in the early stage of the peeling.

EXPLANATION OF REFERENCE NUMERALS

Figure 1:
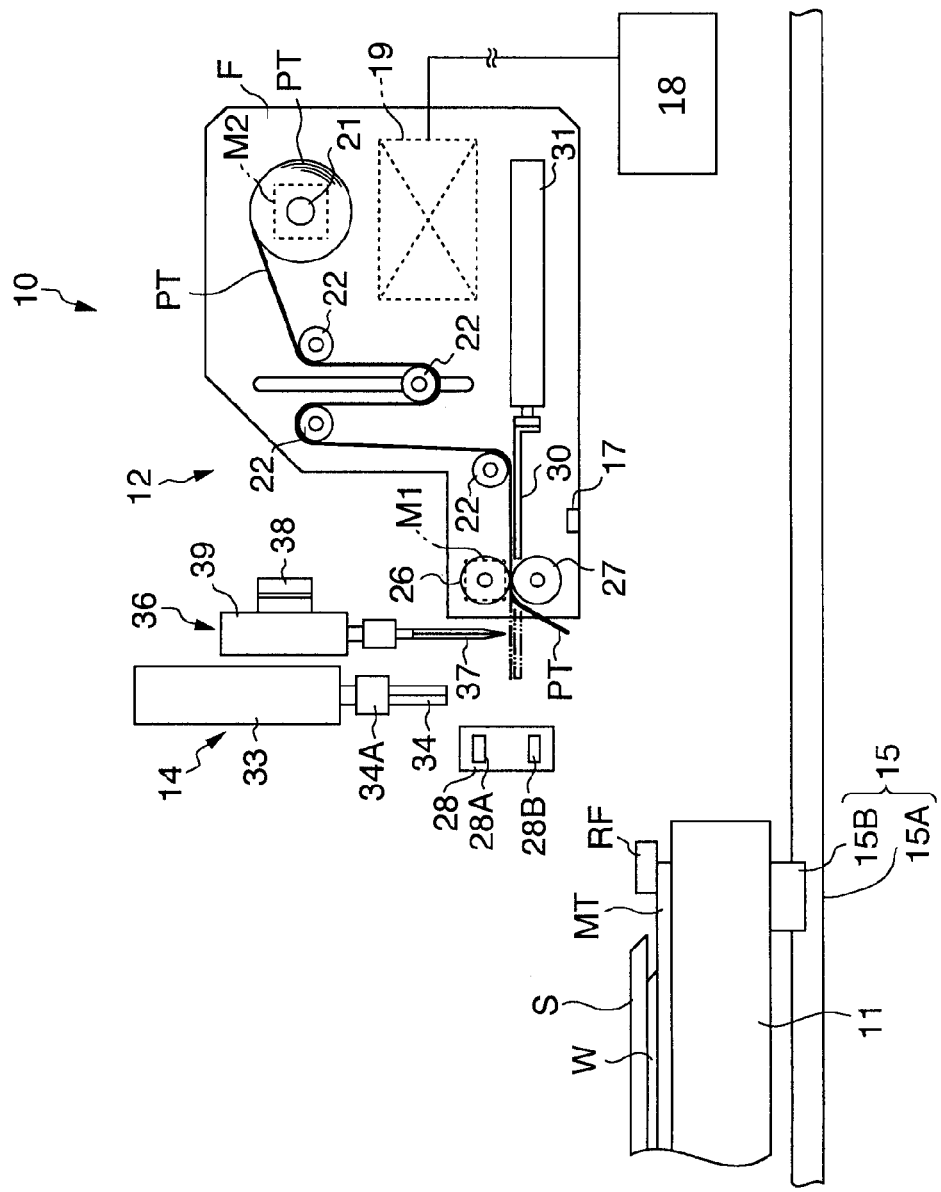
FIG. 1 is a front view schematically showing a sheet peeling apparatus in accordance with an embodiment.

10: sheet peeling apparatus
11: holding means
12: feeding means
14: sticking means
15: moving means
17: detecting means
18: input means
19: controlling means
34A: heater (heating means)
PT: peeling tape
S: adhesive sheet
W: semiconductor wafer (adherend)

DESCRIPTION OF THE PREFERRED EMBODIMENTS

Hereinafter, embodiments of the present invention will be described with reference to the drawings.

FIG. 1 is a front view schematically showing a sheet peeling apparatus according to an embodiment. In this figure, a sheet peeling apparatus 10 comprises: a holding means 11 comprising a table for holding a wafer W as an adherend by sucking the wafer W on the upper face thereof; a feeding means 12 for feeding out a strip of a peeling tape PT to be adhered to a protective adhesive sheet S which is stuck to a circuit surface (upper surface) of the wafer W; a sticking means 14 for sticking a lead end side of the peeling tape PT to the outer periphery side of the adhesive sheet S; a moving means 15 for moving the holding means 11 in the right and left directions in FIG. 1, the moving means 15 comprising a linear motor 15A and a slider 15B thereof; a detecting means 17 capable of detecting a position of the outer periphery of the adhesive sheet S; an input means 18 for inputting a correction value described below; and a controlling means 19 for performing a predetermined control of the holding means 11, the feeding means 12, the sticking means 14, and the moving means 15.

Figure 6:
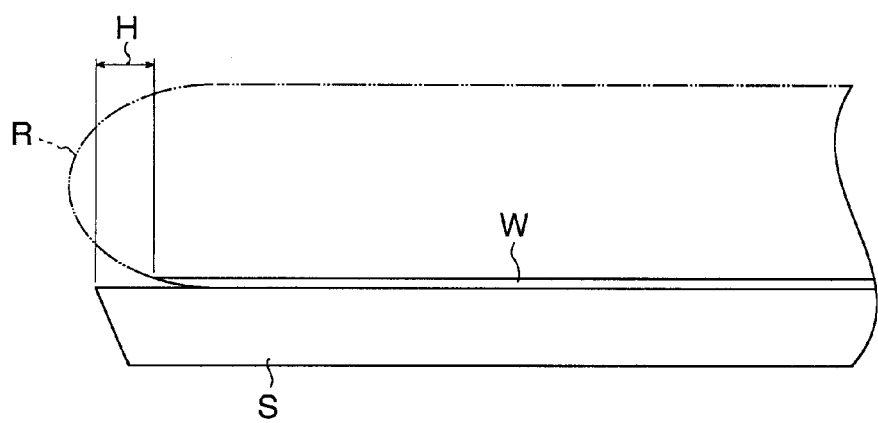
FIG. 6 is an explanatory view showing a state that a wafer is subjected to a rear face grinding and thus a protrusion is formed.

The wafer W is placed inside an opening of a ring frame RF. The wafer W is integrated with the ring frame RF through a mounting tape MT stuck to the opposite surface (lower surface) of the circuit surface, and held by the holding means 11 in such integrated state. Further, in the embodiment, the outer periphery of the adhesive sheet S is protruded outside the outer periphery of the wafer W because the wafer W is made extremely thin, as mentioned above (see FIG. 6).

The feeding means 12 comprises: a support shaft 21 for supporting the wound peeling tape PT; a plurality of guide rollers 22 around which the peeling tape PT is laid; a drive roller 26 rotatably provided through a motor M1; a pinch roller 27 for pinching the peeling tape PT between the drive roller 26 and the pinch roller 27: a chuck 28 comprising upper and lower chucks 28A, 28B, the chuck 28 being provided on the left side of the drive roller 26 and the pinch roller 27, and capable of being moved closer to/away from each other in a vertical direction. Note that the chuck 28 is arranged to be movable in the right and left directions in FIG. 1 through a drive unit (not shown).

Figure 2:
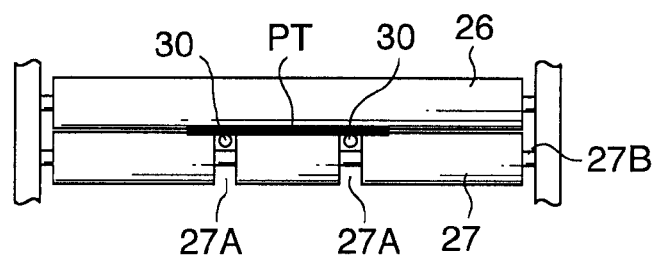
FIG. 2 is an explanatory view of a pinch roller.

The support shaft 21 is rotatably supported by a frame F through a motor M2. As shown in FIG. 2, the pinch roller 27 is divided into three portions, and mounted on a rotary shaft 27B to form clearances 27A. Each clearance 27A is arranged such that a substantially horizontally-oriented shaft-shaped guide member 30 can pass through the clearance. Each guide member 30 is provided so as to move forward and backward through a cylinder 31, so as to appear on the left side of the drive roller 26 and the pinch roller 27 in FIG. 1. Thus, the guide member 30, as indicated in the dashed-two dotted lines in FIG. 1, can support the peeling tape PT fed out to the left side of the drive roller 26 and the pinch roller 27 from below, and guide a lead end region thereof to a position at which the chuck 28 can grasp the region.

The sticking means 14 comprises: a linear motor 33; and a pressing head 34 having a heater 34A, as a heating means, which is provided so as to move forward and backward in a vertical direction by the linear motor 33. By pressing and heating, with the pressing head 34, the peeling tape PT fed out on the upper surface side of the adhesive sheet S by the chuck 28, the sticking means 14 is configured to weld the peeling tape PT to the adhesive sheet S to bond them.

A tape cutting means 36 is provided on the right side of the sticking means 14. The tape cutting means 36 comprises a cutter blade 37, a cutting cylinder 38 for moving the cutter blade 37 in a direction perpendicular to the paper surface in FIG. 1, and a vertical cylinder 39 for moving the cutting cylinder 38 in a vertical direction in FIG. 1.

The detecting means 17 comprises a sensor provided in the lower section of the frame F on the right side of the pinch roller 27. The detecting means 17 is arranged to detect a position of the outer periphery of the adhesive sheet S passing directly under the detecting means 17 while the wafer is moved by the moving means 15, and be able to output a position signal which corresponds to the detected position to the controlling means 19.

The input means 18 comprises a touch panel and the like which is connected electrically to the controlling means 19. The input means 18 can input a correction value of the movement amount of the holding means 11 by the moving means 15, and operating conditions and data of each means controlled through the controlling means 19; and can output them to the controlling means 19.

The controlling means 19 includes the following functions: inputting the position signal by detected and outputted by the detecting means 17; storing data such as the correction value inputted by the input means 18; determining a pressing position of the peeling tape PT onto the adhesive sheet S based on an output signal from the detecting means 17 and the correction value from the input means 18; and controlling the movement amount of the moving means 15 and a timing of pressing of the sticking means 14 so that the peeling tape PT is stuck at the pressing position.

Next, a method for peeling an adhesive sheet S using the sheet peeling apparatus 10 will be now described.

Figure 3:
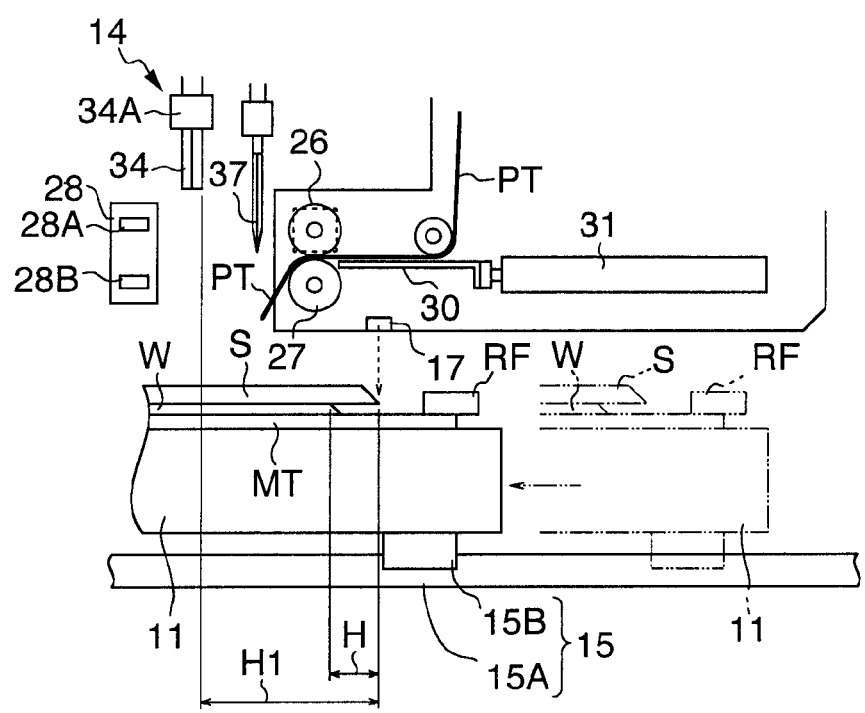
FIG. 3 is an explanatory view showing a state that a detecting means detects the outer periphery of an adhesive sheet.

Initially, the peeling tape PT pulled out of the support shaft 21 is laid around each guide roller 22, and then the lead end side of the peeling tape PT is passed between the drive roller 26 and the pinch roller 27. A protrusion amount H of the outer periphery of the adhesive sheet S from the outer periphery of the wafer W (see FIG. 3) is inputted as the correction value through the input means 18. Moreover, a horizontal distance H1 from the detecting means 17 to the pressing head 34 (see FIG. 4) is stored in advance in the controlling means 19. Note that the protrusion amount H can be computed from a relation between a cut radius of the adhesive sheet S and a grinding amount of the wafer W.

Firstly, the wafer W integrated with the ring frame RF is held on the upper surface of the holding means 11 through a conveying means (not shown). Then, as indicated in the dashed-two dotted lines in FIG. 3, the holding means 11 is moved through the moving means 15 such that the outer periphery on the right side of the adhesive sheet S in FIG. 1 is located on the right side of the detecting means 17. Then, the holding means 11 is moved to left while the detecting means 17 performs a sensing. An indicated with a solid line in FIG. 3, when the right outer periphery of the adhesive sheet S has moved to a position directly under the detecting means 17, the detecting means 17 detects such right outer periphery, and outputs a coordinate thereof as a signal to the controlling means 19.

Secondly, the controlling means 19 determines a movement distance H2 of the holding means 11 by means of the following equation (1) to control the moving means 15, $$\text{Movement distance } H2 = \text{Horizontal distance } H1 - \text{Protrusion amount } H \quad (1)$$

where the movement distance H2 is a distance from a position at which the detecting means 17 detects the right outer periphery of the adhesive sheet S to a position at which the holding means 11 is stopped and stands by to press the peeling tape PT with the pressing head 34.

Based on this, the movement amount of the holding means 11 by the moving means 15 is adjusted to be displaced by the protrusion amount H relative to the horizontal distance H1, so that the pressing position of the peeling tape PT is determined.

The motor M1 is activated to rotate the drive roller 26, so that the peeling tape PT having a predetermined length is fed out on the left side of the drive roller 26 and the pinch roller 27. Subsequently, the cylinder 31 is activated to move forward the guide member 30 to a position indicated in the dashed-two dotted lines in FIG. 1, and a driving means (not show) is activated to position the guide member 30 and the peeling tape PT between upper and lower chucks 28A, 28B. Then, the guide member 30 retreats, and upper and lower chucks 28A, 28B approach each other to grasp the peeling tape PT. After that, the peeling tape PT is pulled out by moving the chuck 28 to left, and the peeling tape PT is positioned below the pressing head 34.

Figure 4:
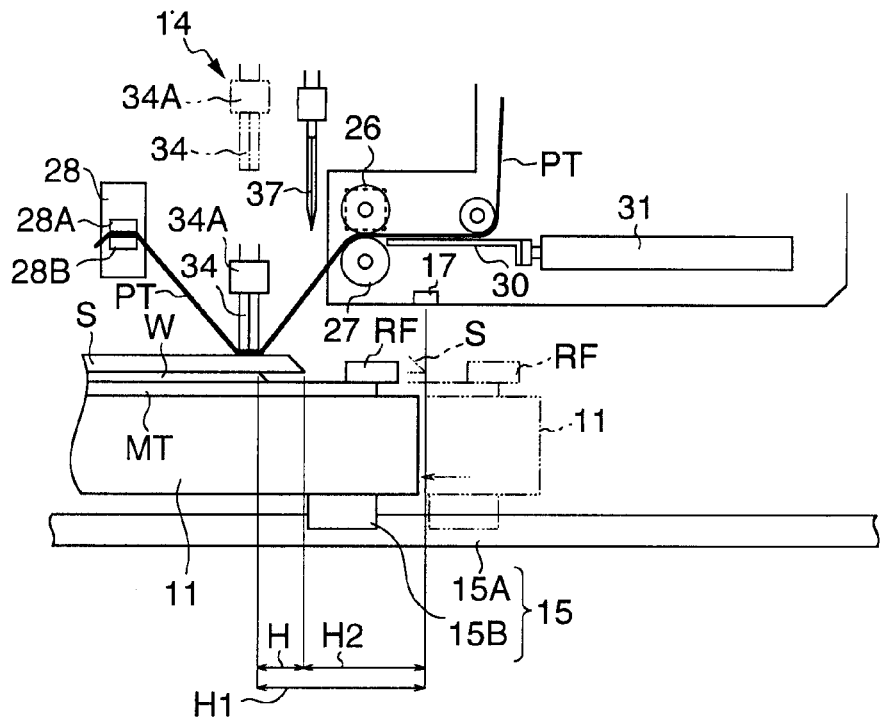
FIG. 4 is an explanatory view showing a state that a sticking means sticks a peeling tape.

Then, as shown in FIG. 4, the pressing head 34 heated by the heater 34A is moved downward with the linear motor 33, and presses the peeling tape PT on the adhesive sheet S while heating it to stick the peeling tape PT to the adhesive sheet S.

At this time, since the step for setting a sticking position as mentioned above is performed, the adhesive sheet S is not adhered to the mounting tape MT by being pressed with the pressing head 34, and the sticking position of the peeling tape PT can be brought to the outer periphery of the wafer W as close as possible.

Figure 5:
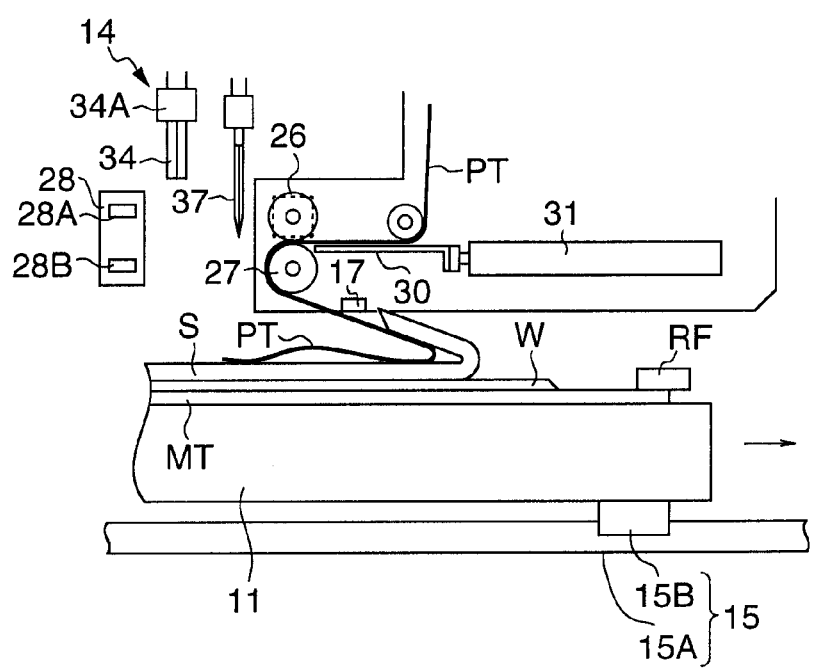
FIG. 5 is an explanatory view showing a state that the adhesive sheet is being peeled off.

After the peeling tape PT is stuck to the adhesive sheet S, the grasp of the peeling tape PT by the chuck 28 is released, and the motor M1 locks the rotation of the drive roller 26. Then, as shown in FIG. 5, the supporting means 11 is moved to right through the moving means 15 such that the peeling tape PT stuck to the adhesive sheet S and the holding means 11 are moved relative to each other in the right and left directions in FIG. 5. Thus, the adhesive sheet S is folded on the wafer W, so that the adhesive sheet S is peeled off from the right outer periphery in FIG. 5. At this time, since setting the sticking position of the peeling tape PT as mentioned above, the mounting tape MT is not pulled by the peeling tape PT, and therefore there arises no trouble such as causing damage to the wafer W.

When peeling off of the adhesive sheet S is finished, the adhesive sheet S stuck to the peeling tape PT hangs on the left side of the drive roller 26 and the pinch roller 27. In such a state, the guide member 30 is moved forward and the cylinders 38, 39 are activated to cut the peeling tape PT on the guide member 30. Then, the holding means 11 returns to the left position. The wafer W with ring frame RF is conveyed in place by the conveying means (not shown), and a new wafer W with the ring frame RF is transferred onto the holding means 11. From this time, the above operations are performed likewise.

Therefore, according to this embodiment, the pressing head 34, can press the peeling tape PT on the outer periphery of the wafer W. Even when the outer periphery of the adhesive sheet S is protruded outside the outer periphery of the wafer W, the protruded adhesive sheet S can be prevented from being pressed. Thus, the adhesive sheet S can be avoided from adhering to the mounting tape MT, and can be prevented from causing damage to the wafer W when peeled.

The best arrangement and method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

Accordingly, it is to be understood that the descriptions limited in the shape and the like disclosed above are meant to be merely illustrative and explanatory to facilitate understanding of the present invention and not to limit the invention. Therefore, descriptions by names of the elements by removing a part or all of the limitations such as about the shape shall be included in the present invention.

For example, a calculating method for determining the pressing position of the pressing head 34 in the controlling means 19 is not limited to the above equation (1), but may be modified variously as long as the pressing position is calculated based on the output signal from the detecting means 17 and the correction value from the input means 18, and the adhesive sheet S protruded outside can be prevented from adhering to other portion while the pressing position is brought close to the outer periphery of the wafer W. In particular, by setting the correction value from the input means 18 to the movement distance H2, the pressing position of the peeling tape PT by the pressing head 34 may be determined base on the movement distance H2 and the output signal from the detecting means 17.

Also, the adherends in the present invention are not limited to semiconductor wafers, but may include other adherends such as glass plates, steel plates, or resin plates, and semiconductor wafers may be silicon wafers or compound wafers.

Further, the peeling tape PT may adopt a pressure-sensitive adhesive tape other than a heat-sensitive adhesive tape.

Furthermore, the relative movement between the peeling tape PT and the holding means 11 may be adapted as follows: the peeling tape PT is moved to left in FIG. 5 while the holding means 11 is stopped, or both are moved away from each other.

Still furthermore, the sensor constituting the detecting means 17 may be a phototube, an area sensor, a camera, or the like.

Yet still furthermore, the controlling means 19 may include a sequencer, personal computer, and the like.

What is claimed is:

1. A sheet peeling method for sticking a peeling tape to an adhesive sheet stuck to an adherend, and peeling off the adhesive sheet from the adherend through the peeling tape, comprising steps of:
   holding the adherend by a holding means;
   detecting a position of the outer periphery of the adhesive sheet stuck to the adherend;
   determining a pressing position of the peeling tape to the adhesive sheet based on the detected position of the outer periphery thereof and a correction value inputted by an input means, wherein the correction value is a protrusion amount of the outer periphery of the adhesive sheet from the outer periphery of the adherend;
   feeding out the peeling tape;
   sticking the peeling tape at the determined pressing position; and
   peeling the adhesive sheet by a relative movement of the peeling tape stuck to the adhesive sheet and the holding means.

2. The sheet peeling method according to claim 1, wherein
   the movement amount of the holding means is adjusted by the protrusion amount when determining the pressing position.

3. A sheet peeling apparatus for sticking a peeling tape to an adhesive sheet stuck to an adherend, and peeling off the adhesive sheet from the adherend through the peeling tape, comprising:
   a holding means for holding the adherend;
   a feeding means for feeding out the peeling tape;
   a sticking means for sticking the peeling tape by pressing the peeling tape onto the adhesive sheet;
   a moving means for moving the peeling tape stuck to the adhesive sheet and the holding means relative to each other to peel the adhesive sheet;
   a detecting means for detecting the position of the outer periphery of the adhesive sheet stuck to the adherend, and outputting a signal thereof;
   an input means for inputting a correction value for performing a predetermined control of the moving means, wherein the correction value is a protrusion amount of the outer periphery of the adhesive sheet from the outer periphery of the adherend; and
   a controlling means for determining a pressing position of the peeling tape to the adhesive sheet based on the output signal from the detecting means and the correction value from the input means, and controlling the moving means so as to perform the sticking at the pressing position.

4. The sheet peeling apparatus according to claim 3, wherein
   the controlling means adjusts, by the protrusion amount, the movement amount of the holding means by the moving means when determining the pressing position.

5. The sheet peeling apparatus according to claim 3 or 4, wherein the sticking means has a heating means capable of heating the peeling tape.

* * * * *